US008542518B2

(12) United States Patent
Bratkovski et al.

(10) Patent No.: US 8,542,518 B2
(45) Date of Patent: Sep. 24, 2013

(54) PHOTO-RESPONSIVE MEMORY RESISTOR AND METHOD OF OPERATION

(75) Inventors: Alexandre M. Bratkovski, Mountain View, CA (US); Iakov Veniaminovitch Kopelevitch, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 552 days.

(21) Appl. No.: 12/751,437

(22) Filed: Mar. 31, 2010

(65) Prior Publication Data
US 2011/0242873 A1 Oct. 6, 2011

(51) Int. Cl.
*G11C 11/00* (2006.01)

(52) U.S. Cl.
USPC ............ 365/148; 365/106; 365/127; 365/215

(58) Field of Classification Search
USPC ................ 365/148, 163, 158, 171, 173, 112, 365/215, 216, 106, 127
See application file for complete search history.

(56) References Cited

U.S. PATENT DOCUMENTS

| | | | | |
|---|---|---|---|---|
| 3,801,966 A * | 4/1974 | Terao | ............................. | 365/113 |
| 5,597,614 A * | 1/1997 | Noguchi et al. | ............... | 427/162 |
| 6,077,729 A * | 6/2000 | Harshfield | ..................... | 438/128 |
| 6,204,139 B1 | 3/2001 | Liu et al. | | |
| 6,850,432 B2 * | 2/2005 | Lu et al. | ......................... | 365/163 |
| 7,106,622 B2 * | 9/2006 | Nangle | .......................... | 365/163 |
| 7,148,533 B2 | 12/2006 | Hsu et al. | | |
| 7,580,596 B1 * | 8/2009 | Meijer et al. | ....................... | 385/8 |
| 7,596,016 B2 * | 9/2009 | Johnson | ......................... | 365/163 |
| 7,630,233 B2 * | 12/2009 | Kato et al. | ..................... | 365/163 |
| 7,768,815 B2 * | 8/2010 | Chen et al. | ..................... | 365/151 |
| 7,795,617 B2 * | 9/2010 | Koyama et al. | .................. | 257/59 |
| 8,426,841 B2 * | 4/2013 | Seo et al. | ........................... | 257/4 |
| 2008/0285329 A1* | 11/2008 | Shuy et al. | ..................... | 365/148 |
| 2008/0308783 A1 | 12/2008 | Ahn et al. | | |
| 2009/0027944 A1 | 1/2009 | Ufert | | |
| 2009/0302315 A1 | 12/2009 | Lee et al. | | |
| 2012/0012810 A1* | 1/2012 | Thylen et al. | ..................... | 257/4 |

OTHER PUBLICATIONS

Chung, "Intercalated Graphite as a Smart Material for High-Stress, High-Strain, Low-Electric-Field Electromechanical Switching", Journal of Smart Materials and Structures, Sep. 1992, vol. 1, No. 3, pp. 233-236, IOP Publishing Ltd.

Ezquerra et al., "Memory and Switching Effects in Polycarbonate-Graphite Composites", Journal of Applied Physics, Jul. 15, 1985, vol. 58, No. 2, pp. 1061-1063, American Institute of Physics.

Gerstner et al., "Nonvolatile Memory Effects in Nitrogen Doped Tetrahedral Amorphous Carbon Thin Films", Journal of Applied Physics, Nov. 1998, vol. 84, No. 10, pp. 5647-5651, American Institute of Physics.

(Continued)

*Primary Examiner* — Harry W Byrne
*Assistant Examiner* — Lance Reidlinger

(57) ABSTRACT

An optically-controlled memory resistor includes (1) a memory resistor having a first electrode, a second electrode, and a photo-responsive active layer disposed between the first and second electrodes and (2) a light source in cooperation with the memory resistor. The light source is configured to controllably illuminate the memory resistor for affecting a resistance state exhibited by the memory resistor. Also, a method for operating a memory resistor includes changing a resistance state of the memory resistor in response to an application of photons to the memory resistor.

7 Claims, 6 Drawing Sheets

(56) References Cited

OTHER PUBLICATIONS

Katsuno et al, "Highly Photoconductive Amorphous Carbon Nitride Films Prepared by Cyclic Nitrogen Radical Sputtering", Applied Physics Letters, Oct. 2004, vol. 85, No. 14, pp. 2803-2805, American Institute of Physics.

Makarov et al., "Photoconductivity of the TiO2 + Fullerene-C60 Bilayers: Steady-State and Time-Resolved Measurements", Chemical Physics Letters, vol. 355, Iss. 5-6, pp. 504-508, Apr. 8, 2002.

Ning et al., "Excimer-Laser-Induced Permanent Electrical Conductivity in Solid C60 Films", Applied Physics A: Materials Science & Processing, Jun. 1996, vol. 62, No. 6, pp. 509-512, Springer Berlin/Heidelberg.

Ota et al., "Non-Linear Current-Voltage Characteristics of Graphite/Piezoelectric Composite", Journal of the Ceramic Society of Japan, 2002, vol. 110, No. 1280, pp. 310-313.

Pickett et al., "Switching Dynamics in Titanium Dioxide Memristive Devices", Journal of Applied Physics, 2009, vol. 106, Iss. 7, pp. 074508-1-074508-6, American Institute of Physics.

Rao et al., "Photoinduced Polymerization of Solid C60 Films", Science, Feb. 1993, vol. 259, No. 5097, pp. 955-957.

Sawa et al., "Resistive Switching in Transition Metal Oxides", Materialstoday, Jun. 2008, vol. 11, No. 6, pp. 28-36, Elsevier, Ltd.

Strekalov et al., "Early Stages of Laser Graphitization of Diamond", Applied Physics A: Materials Science & Processing, Mar. 2003, vol. 76, No. 4, pp. 603-607, Springer Berlin/Heidelberg.

Strukov et al., "The Missing Memristor Found", Nature, May 2008, vol. 453, pp. 80-83, 1154, Nature Publishing Group.

Waser et al., "Nanoionics-Based Resistive Switching Memories", Nature Materials, Nov. 2007, pp. 833-840, vol. 6, Nature Publishing Group.

Yang et al., "Memristive Switching Mechanism for Metal/Oxide/Metal Nanodevices", Nature Nanotechnology, Jul. 2008, pp. 429-433, vol. 3, Macmillan Publishers Limited.

Zhou et al., "Electrical-Thermal Switching Effect in High-Density Polyethylene/Graphite Nanosheets Conducting Composites", Journal of Materials Science, Jul. 2008, vol. 43, No. 14, pp. 4886-4891, Springer Netherlands.

* cited by examiner

PHOTO-RESPONSIVE MEMORY RESISTOR AND METHOD OF OPERATION

BACKGROUND

A memory resistor is a device that exhibits a switchable resistance state such that the same applied voltage to the memory resistor can produce different responses from the memory resistor depending on the memory resistor's resistance state. When the memory resistor exhibits a resistance state corresponding to a high resistance, an application of a given voltage across the memory resistor will draw a relatively lower current than would a memory resistor that exhibits a resistance state corresponding to a relatively lower resistance if the same voltage is applied thereto.

Examples of memory resistors include unipolar memory resistors and bipolar memory resistors. With a unipolar memory resistor, applied voltages of the same polarities (but different magnitudes, e.g., $V_{ON}$ and $V_{OFF}$) are used to switch the memory resistor between different states. With a bipolar memory resistor, applied voltages of different polarities (and of sufficient magnitude) are used to switch the memory resistor between different states.

Given these properties, memory resistors can be used as memory cells where the resistance state can be used to denote a logical "1" or "0" for data storage. Moreover, because the resistance state of the memory resistor can retain its current resistance state in the absence of an applied voltage, memory resistors can be used for nonvolatile data storage.

DETAILED DESCRIPTION

A memory resistor may be switched from an ON to an OFF state, and from an OFF to an ON state by application of a sufficient voltage to the memory resistor. Photon fields can be used to affect the switching properties of such a memory resistor. The result is an optically-controllable memory resistor that is easy to fabricate and to operate, that can be made of lightweight, inert materials, such as carbon, and that has a wide range of applications, including use as non-volatile memory and as an optical switch or connector, for example. Further, such an optically-controllable memory resistor, when used as non-volatile memory, can be flash-erased by the application of an appropriate photon field.

Figure 1A:
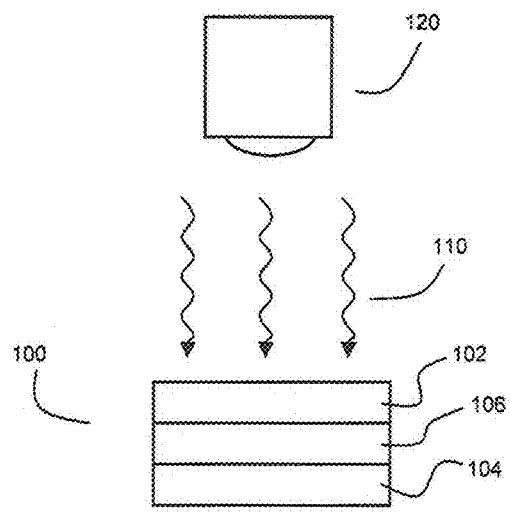
FIGS. 1(a) and 1(b) depict an exemplary embodiment of a photo-responsive memory resistor.
Figure 1B:
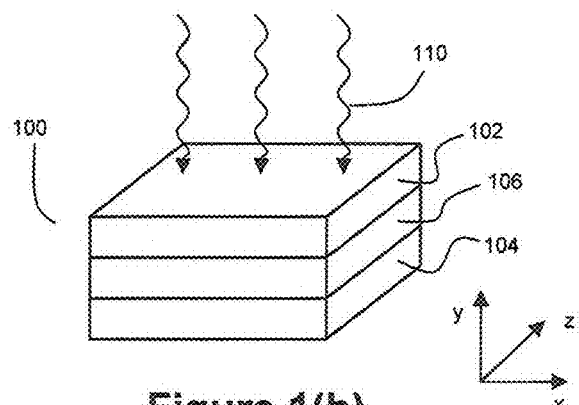

FIG. 1(a) depicts a cross-sectional view of an exemplary photo-responsive memory resistor 100. FIG. 1(b) depicts a perspective view of this photo-responsive memory resistor. The memory resistor 100 can be a thin film device comprising a photo-responsive active layer 106 disposed between two electrodes 102 and 104. As used herein, the photo-responsive active layer 106 is said to be positioned "between" electrodes if a carrier flow from one electrode to another passes through the active layer 106. For example, the photo-responsive active layer 106 can be sandwiched between an upper electrode 102 and a lower electrode 104 as shown in FIGS. 1(a) and (b).

The electrodes 102 and 104 can be formed from any reasonably good electron conductor, and the electrode material need not be the same for both the upper electrode 102 and lower electrode 104. An example of a material that could be used for electrodes 102 and/or 104 is Pt. However, other materials could be used, including a large variety of metals as well as electron-conducting nonmetals (e.g., Ag, Al, Au, Co, Hf, Ir, Pd, Ru, Ti, W, Zn, and Zr). Furthermore, the electrodes 102 and/or 104 may employ metal oxides such as $RuO_2$ and $IrO_2$ as oxygen-blocking layers. In an exemplary embodiment, at least one of the electrodes 102 and 104 can be formed from an optically-transmissive material, as explained below.

The photo-responsive active layer 106 can be an insulation layer formed from materials having sufficiently large photo-conductivity and/or photo-induced material transformation properties. For example, the photo-responsive active layer 106 can be formed from a transition metal oxide. The inventors believe that the photoresistivity properties of transition metal oxides can play a role in the memory resistor's switching phenomena. An example of a suitable transition metal oxide for use as the photo-responsive active layer is $TiO_2$. However, other transition metal oxides could be used, such as NiO, $SrTiO_3$, $Ta_2O_5$, $Nb_2O_5$, $VO_2$, $ZrO_2$, NbO, CuO, etc. Examples of memory resistors having a transition metal oxide active layer that the inventors believe is suitable for use in a photo-responsive memory resistor are described in Yang et al., "Memristive switching mechanism for metal/oxide/metal nanodevices", Nature Nanotechnology, Vol. 3, pp. 429-433, July 2008; Waser et al., "Nanoionics-based resistive switching memories", Nature Materials, Vol. 6, pp. 833-840, November 2007; Strukov et al., "The missing memristor found", Nature, Vol. 453, pp. 80-83, 1154, May 2008; and Sawa, Akihito, "Resistive switching in transition metal oxides", Materials Today, Vol. 11, No. 6, pp. 28-36, June 2008, the entire disclosures of each of which are incorporated herein by reference.

Also, carbon-based materials can be used as the photo-responsive active layer 106. The inventors believe that the photo-polymerization and/or photoresistivity properties exhibited by carbon-based materials can play a role in the memory resistor's switching phenomena. An example of a carbon-based material that can be used in the photo-responsive active layer 106 is a graphite-polycarbonate composite. However, other carbon-based materials could be used, such as intercalated graphite, graphite/piezoelectric composites, polyethylene/graphite nanosheets conducting composites, nitrogen-doped tetrahedral amorphous carbon thin films, etc. For example, the inventors believe that the following publications describe carbon-based active layers that can be suitable for use in a photo-responsive memory resistor: Ezquerra et al., "Memory and switching effects in polycarbonate-graphite composites", J. Appl. Phys., Vol. 58, No. 2, pp. 1061-1063, July 1985; Chung, D. D. L., "Intercalated graphite as a smart material for high-stress, high-strain, low-electric-field electromechanical switching", Smart Mater. Struct., Vol. 1, pp. 233-236, 1992; Ota et al., "Non-Linear Current-Voltage Characteristics of Graphite/Piezoelectric Composite", Journal of the Ceramic Society of Japan, Vol. 110, No. 4, pp. 310-313, 2002; Zhou et al., "Electrical-thermal switching effect in high-density polyethylene/graphite nanosheets conducting composites", J. Mater. Sci., Vol. 43, pp. 4886-4891, 2008; and Gerstner, "Nonvolatile memory effects in nitrogen doped tetrahedral amorphous carbon thin films", Journal of Applied Physics, Vol. 84, No. 10, pp. 5647-5651, November 1998, the entire disclosures of each of which are incorporated herein by reference.

The memory resistor 100 can be a nanoscale memory resistor. As used herein, "nanoscale" refers to dimensions of length, width and thickness for the memory resistor that are not greater than approximately 500 nm in at least one dimension. Thickness refers to the vertical (y) dimension shown in FIGS. 1(a) and (b), while length and width refer to the z and x dimensions shown in FIGS. 1(a) and (b) respectively. An exemplary thickness for the photo-responsive active layer is approximately 50 nm, although other thicknesses could be used. For example, a thickness in the range of approximately 5-50 nm may be appropriate. For lower thickness values, the use of carbon-based photo-responsive materials such as graphene as layer 106 can be advantageous due to the stability that graphene exhibits. The length and width for the memory resistor 100 can depend on the desired scaling, and submicron dimensions are suitable. Also, while the examples of FIGS. 1(a) and (b) illustrate generally square or rectangular memory resistor architectures, it should be understood that other geometries could be employed. For example, the memory resistor could exhibit a more circular shape along the xz plane. Further still, while the examples of FIGS. 1(a) and (b) show the electrodes 102 and 104 having effectively the same thickness, length and width as the photo-responsive active layer 106, this need not be the case.

Figure 2A:
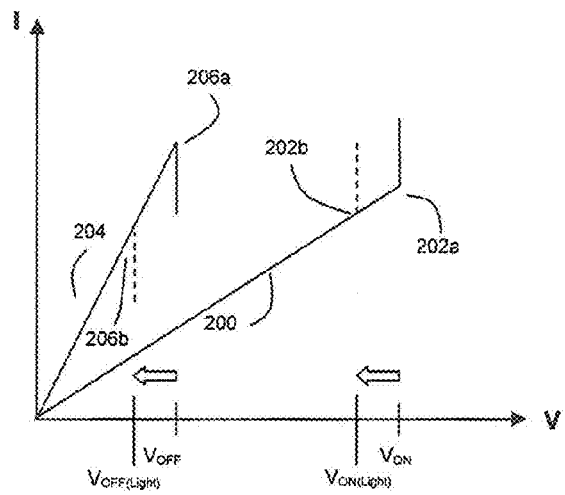
FIGS. 2(a)-(c) depict exemplary current versus voltage graphs showing estimations of how light can affect the threshold voltages at which exemplary unipolar photo-responsive memory resistors can switch between resistance states.
Figure 2B:
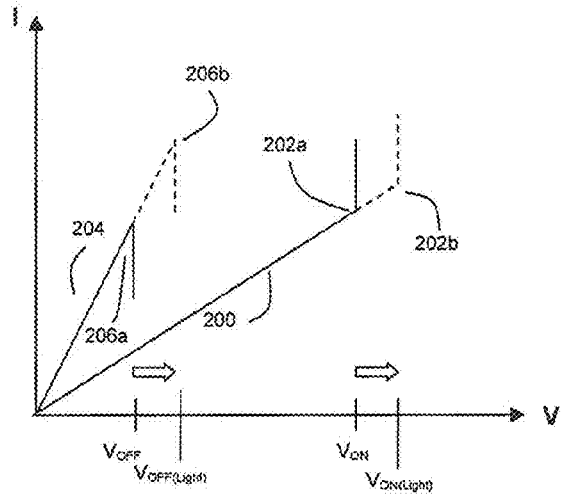
Figure 2C:
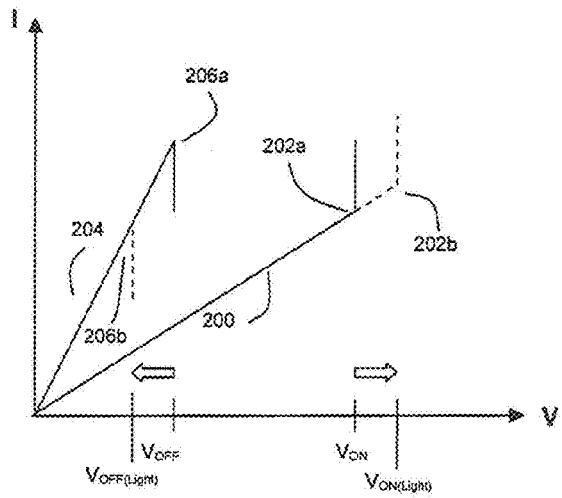

In operation, a light source 120 produces a plurality of photons 110 that impact the memory resistor 100. These photons 110 induce a change in the resistive properties of the photo-responsive active layer to affect the switching properties of the memory resistor 100. The nature of the photo-induced switching effects can vary based on the materials used in the memory resistor 100, including the photo-responsive active layer For example, the solid lines in FIGS. 2(a)-(c) illustrate an exemplary I-V characteristic for a unipolar memory resistor. If the memory resistor is in an "on" (or "set") resistance state (e.g., a resistance state corresponding to a relatively low resistance), when a voltage is applied across the memory resistor 100, the resultant current will increase as shown by line 204 until the "off" (or "reset") voltage threshold ($V_{OFF}$) is reached. Once $V_{OFF}$ is reached, the memory resistor transitions into the "off" resistance state (e.g., a relatively high resistance) and the resultant current significantly drops off due to the increased resistance of the memory resistor (as shown around point 206a). Then, while the memory resistor is in the "off" state, when a voltage is applied across the memory resistor 100, the resultant current will increase as shown by solid line 200 until the "on" voltage threshold ($V_{ON}$) is reached. Once $V_{ON}$ is reached, the memory resistor transitions back to the "on" resistance state having the relatively low resistance. At this point, the resultant current would greatly increase due to the decreased resistance of the memory resistor (as shown around point 202a).

The inventors believe that by illuminating the memory resistor 100 with photons 110, these thresholds can be adjusted. For example, with a photo-responsive active layer 106 that responds to photon illumination by increasing the carrier density in the active layer 106 (e.g., for an active layer 106 formed from any of a number of transition metal oxides), the voltage thresholds can be reduced as generally shown in FIG. 2(a). Thus, the transition point from a high resistance state to a low resistance state can be pushed to a lower voltage when the memory resistor 100 is under illumination (see the dashed lines around point 202b). Furthermore, the transition point from a low resistance state to a high resistance state can also be pushed to a lower voltage when the memory resistor 100 is under illumination (see the dashed line around point 206b). By reducing the voltage thresholds in response to illumination, the memory resistor 100 can likely be switched more quickly because the lower voltage thresholds ($V_{OFF(Light)}$ and $V_{ON(Light)}$) can be reached more quickly from a zero voltage point than a higher voltage could be reached. Thus, by applying a photon field 110 to a memory resistor 100 in tandem with an applied voltage, the memory resistor 100 can be quickly switched.

With a photo-responsive active layer 106 that exhibits photo-polymerization properties (e.g., for an active layer 106 formed from any of a number of carbon-based materials), the voltage thresholds can be increased as generally shown in FIG. 2(b). Thus, the transition point from a high resistance state to a low resistance state can be pushed to a higher voltage when the memory resistor 100 is under illumination (see the dashed lines around point 202b). Furthermore, the transition point from a low resistance state to a high resistance state can also be pushed to a higher voltage when the memory resistor 100 is under illumination (see the dashed line around point 206b).

Furthermore, the inventors believe that photo-responsive active layer materials can also be selected such that the memory resistor 100 exhibits other switching properties, such as an increase in the $V_{ON}$ threshold and a decrease in the $V_{OFF}$ threshold, as generally shown by FIG. 2(c).

Figure 2D:
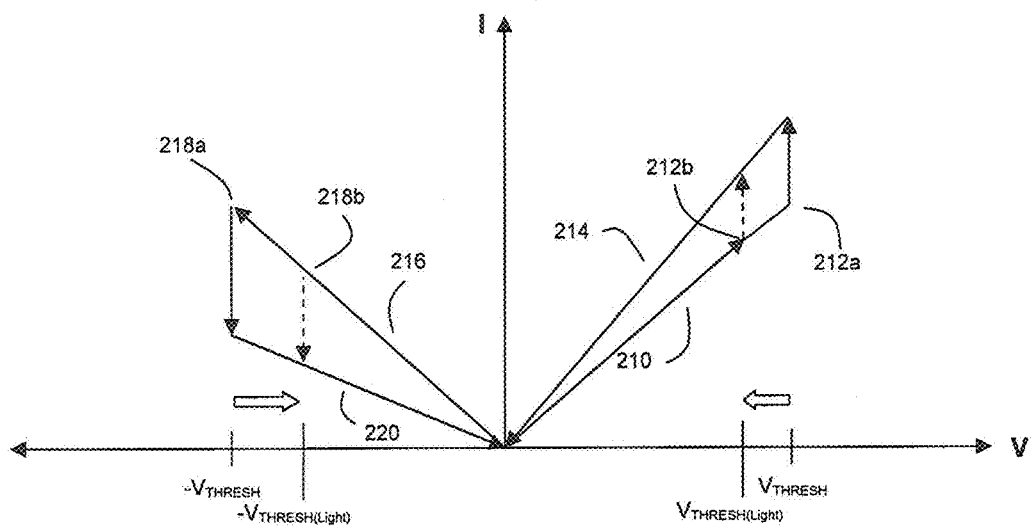
FIG. 2(d) depicts an exemplary current versus voltage graph showing an estimation of how light can affect the threshold voltages at which an exemplary bipolar photo-responsive memory resistor switches between resistance states.

FIG. 2(d) depicts an exemplary I-V characteristic for a bipolar memory resistor (see the solid lines). With a bipolar memory resistor, a positive voltage threshold ($V_{THRESH}$) is used to control the transition from a high resistance state to a low resistance state and a negative voltage threshold ($-V_{THRESH}$) is used to control the transition from a low resistance state to a high resistance state. Thus, if the bipolar memory resistor 100 is in a low resistance state, and a positive voltage is applied across the memory resistor, the resultant current will increase (see line 210) until $V_{THRESH}$ is reached (see point 212a), at which point the memory resistor transitions to a low resistance state and the current correspondingly jumps. Then, as the voltage returns to zero, the current decreases as generally shown along line 214. Then as the voltage goes negative, the current once again increases as shown by line 216 until the negative voltage threshold $-V_{THRESH}$ is reached (see point 218a), at which point the memory resistor transitions to a high resistance state and the current correspondingly drops. Then, as the voltage returns to zero, the current continues to generally decrease as shown by line 220. However, under illumination, the inventors estimate that these thresholds can be controllably adjusted. Once again, the nature of the controlled adjustments will depend on properties of the photo-responsive active layer 106, where photo-induced increases in carrier density are expected to result in reduced voltage thresholds while photo-polymerization effects are expected to result in increased voltage thresholds. In the general illustration of FIG. 2(d), it can be seen that $V_{THRESH}$ and $-V_{THRESH}$ can be reduced in magnitude under illumination, as generally indicated in FIG. 2(d) by the dotted lines around the transition points 212b and 218b corresponding to an illuminated memory resistor 100.

The light source 120 can be a device capable of generating photons 110, such as a laser (e.g., an excimer laser), a light-emitting diode (LED), lamp, and the like. The wavelength of photons 110 used to illuminate the memory resistor 100 can be in a range of approximately 300-1600 nm. Thus, the light source 120 can be configured to generate electromagnetic radiation in the visible light and near infrared (IR) wavelength ranges. Thus, an example of a suitable light source 120 can be a "white" LED which is capable of producing light in the visible light spectrum as well as near IR. Furthermore, the inventors believe that photo-induced switching effects can be achieved for memory resistor 100 even at low intensity photon fields 110 which may provide power consumption advantages. The light source 120 can be controlled by associated circuitry to turn the light source on/off (and/or modulate the intensity of the generated photons 110) as desired to affect the resistance state of the memory resistor 100. Furthermore, the light source may include a light delivery mechanism for providing the photon field 110 to the memory resistor 100. Such a light delivery mechanism may comprise an optical connector with waveguides, wherein an optical fiber feeds the connector (with an LED or the like feeding the optical fiber).

While FIGS. 1(a) and (b) depict, for ease of illustration, the memory resistor 100 being illuminated by photons 110 impacting the upper electrode 102 from above, it should be understood that the light source 120 can be positioned to illuminate the memory resistor 100 from other angles if desired. For example, non-vertical angles of incidence could be employed.

In the event that the electrodes 102/104 are positioned such that photons 110 would be blocked from reaching the photo-responsive active layer 106, at least one of the electrodes 102 and/or 104 can be formed from an optically-transmissive electrode material. For example, this optically-transmissive electrode material can be Indium-Tin-Oxide (ITO) or ZnO. Examples of additional optically-transmissive electrode materials that could be used include carbon nanotube materials, Poly(3,4-ethylenedioxythiophene), Poly(3,4-ethylenedioxythiophene)-tetramethacrylate (PEDOT-TMA), and Poly(3,4-ethylenedioxythiophene) poly(styrenesulfonate) (PEDOT:PSS). The optically-transmissive electrode would thus permit a substantial number of photons 110 of the pertinent wavelength to reach the photo-responsive active layer to cause a photo-induced effect on memory resistor operation.

Figure 3:
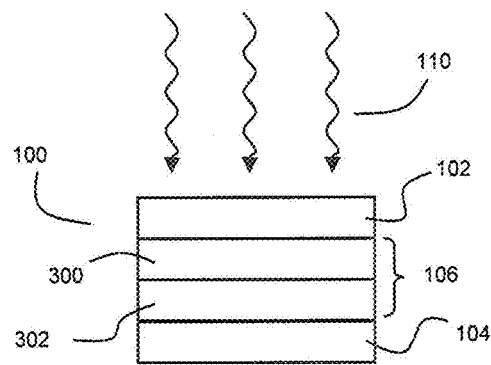
FIG. 3 depicts another exemplary embodiment of a photo-responsive memory resistor.
Figure 4:
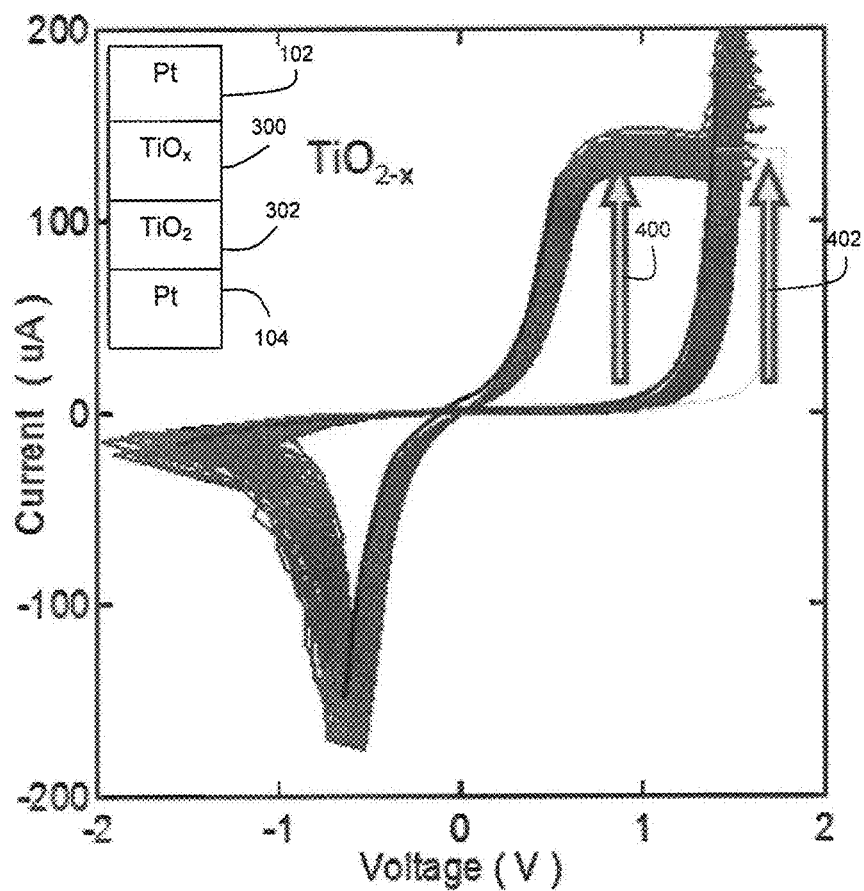
FIG. 4 depicts an estimate of photo-induced changes in the resistive switching characteristics of an exemplary photo-responsive memory resistor having a transition metal oxide active layer.

Furthermore, it should be understood that the photo-responsive active layer 106 may comprise a plurality of active layers. For example, as shown in FIG. 3, the photo-responsive active layer 106 may comprise a first layer 300 and a second layer 302. In this example, the first layer 300 may comprise $TiO_2$ while the second layer may comprise a titanium oxide layer having oxygen vacancies $TiO_{2-x}$ (or vice versa), as described in the Yang article referenced above. FIG. 4 depicts I-V plot lines experimentally measured using 50 experimental switching loops traversed as figures-of-eight by Yang for such a memory resistor 100 having a near-stochiometric $TiO_2$ layer 300 resting on top of an oxygen-deficient $TiO_{2-x}$ layer 302. Arrows 400 and 402 show the estimated photo-induced changes in resistive switching that could be achieved via illumination of such a memory resistor. Arrow 400 shows an estimated decrease in the $V_{OFF}$ voltage threshold, while arrow 402 shows an estimated increase in the $V_{ON}$ voltage.

Figure 5:
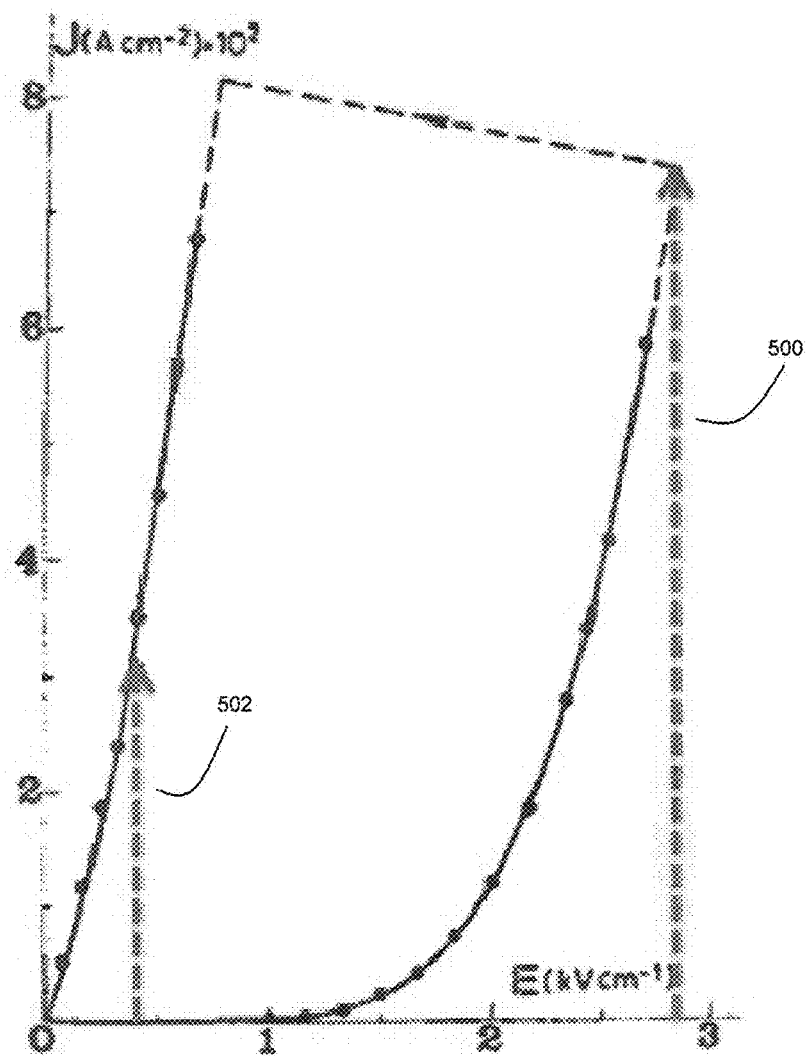
FIG. 5 depicts an estimate of photo-induced changes in the resistive switching characteristics of an exemplary photo-responsive memory resistor having a carbon-based active layer.

FIG. 5 depicts a current density (J)—electric field (E) hysteresis plot showing the switching phenomenon between high resistance and low resistance states demonstrated at room temperature for a memory resistor having an active layer 106 formed of a graphite-polycarbonate composite as described in the Ezquerra article referenced above. This memory resistor device exhibited an electric field threshold ($E_{th-ON}$) at around 2 kV/cm to switch the device to a low resistance state an electric field threshold ($E_{th-OFF}$) at around 0.8 kV/cm to turn the device to a high resistance state. Arrows 500 and 502 show the estimated photo-induced changes in resistive switching that could be achieved via illumination of such a memory resistor employing a graphite-polycarbonate composite as the photo-responsive active layer 106. Arrow 500 shows an estimated increase in the $E_{th-ON}$ threshold (to around 2.8 kV/cm), while arrow 502 shows an estimated decrease in the $E_{th-OFF}$ threshold (to around 0.4 kV/cm).

The inventors note that the variation of the resistance of a memory resistor employing a carbon-based composite material as the active layer 106 is most pronounced in a vicinity of the percolation metal-insulation transition. At the same time, the inventors note that light can drastically modify properties of carbon-based materials—for example, increasing the electrical conductivity of fullerene films under excimer laser illumination.

Further still, the inventors believe that illumination of a memory resistor 100 having a photo-responsive active layer can itself change the resistance state of the memory resistor 100. The photons 110 can increase the carrier density in the memory resistor's active layer 106 and these photo-carriers can cause the memory resistor to switch resistance states. This capability can be advantageous for a number of applications, including but not limited to memory resistor-based data storage, optical switching and optical sensing. For example, bursts of photon fields 110 can be used to "flash erase" the data stored in a memory cell formed by an array of memory resistors.

Figure 6A:
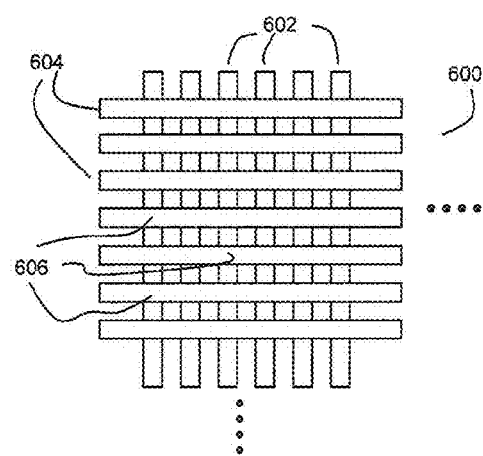
FIGS. 6(a) and (b) depict an exemplary memory cell array comprising a plurality of photo-responsive memory resistors.
Figure 6B:
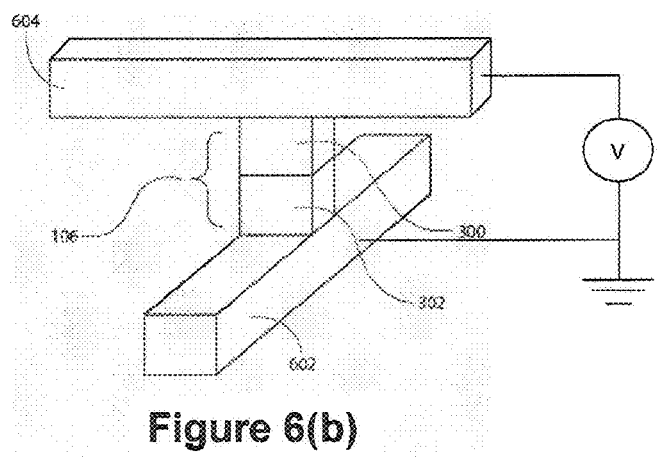

FIG. 6(a) depicts an exemplary memory cell 600 employing an array of photo-responsive memory resistors 100. A plurality of nanowires 602 and 604 are laid in a grid as shown with one orientation of the nanowires 602 serving as a lower layer and the other orientation of the nanowires 604 serving as the upper layer. At the overlap points 606 between the nanowires, a photo-responsive active layer 106 is deposited between the two nanowires 602 and 604. For a photo-responsive memory resistor embodiment such as that of FIG. 3, FIG. 6(b) depicts a cut-away perspective view of this arrangement. The upper electrode 102 would be formed by the one of the upper nanowires 604 and the lower electrode 104 would be formed by the one of the lower nanowires 602. Disposed between the nanowire electrodes is the photo-responsive active layer 106 (which may comprise a plurality of layers, such as layers 300 and 302). The nanowires can be fabricated by nanoimprint lithography and the thin film photo-responsive active layer can be fabricated using sputter deposition or atomic layer deposition (ALD) methods. The voltages applied across the memory resistors 100 formed by the array can applied with the lower nanowires 602 grounded.

In operation, voltages applied across the nanowires can be used to control the resistance states of the different memory resistors 100 at points 606 in the array. These resistance states would serve to represent bits of data. By illuminating the array 600 or select portions thereof, a practitioner can alter various memory resistors' resistance states and thus change the data stored by the array. This type of action may include what can be referred to as a "flash erase" operation. During a flash erase operation, a burst of photons 110 would impact the array 600 to change the impacted memory resistor's resistance states, effectively turning all of the impacted memory resistors "on" or "off" and thereby effectively erasing whatever data was stored by the array.

The inventors further believe that for certain types of memory resistors 100, namely memory resistors that use carbon-based materials in the active layer 106 that are susceptible to fullerene photo-polymerization and/or diamond photo-graphitization, a photon burst 110 of sufficient strength to achieve photo-polymerization or diamond photo-graphitization may be particularly effective for causing the memory erasure.

Figure 7A:
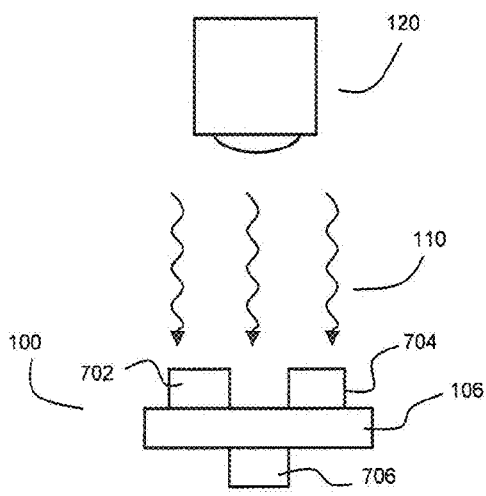
FIGS. 7(a) and (b) depict additional exemplary embodiments of a photo-responsive memory resistor.
Figure 7B:
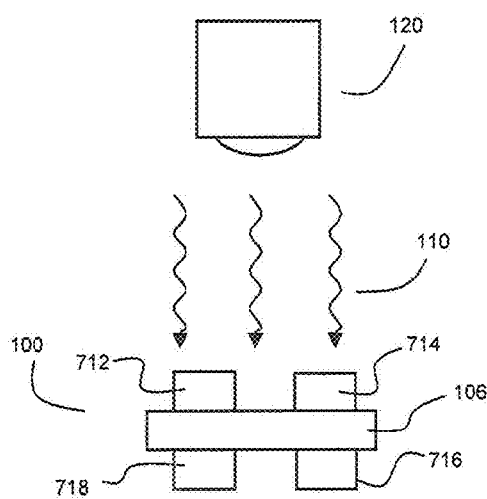

Also, while the exemplary embodiments described above show two-terminal memory resistors 100, it should be understood that the photo-responsive memory resistors 100 need not be limited to two-terminal devices. For example, the memory resistor 100 may be a three-terminal device as shown in FIG. 7(a) (wherein the photo-responsive active layer 106 is positioned between three electrodes 702, 704 and 706). As another example, the memory resistor 100 may be a four-terminal device as shown in FIG. 7(b) (wherein the photo-responsive active layer 106 is positioned between four electrodes 712, 714, 716 and 718).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof. It should further be understood that the embodiments disclosed herein include any and all combinations of features as disclosed herein and/or described in any of the dependent claims.

What is claimed is:

1. An optically-controllable memory resistor, comprising:
a memory resistor comprising a first electrode, a second electrode, and a photo-responsive active layer disposed between the first and second electrodes, wherein:
at least one of the electrodes comprises an optically-transmissive electrode for permitting photons to impact the photo-responsive active layer, and
the photo-responsive active layer is formed from a transition metal oxide and is such that the photons impacting the photo-responsive active layer alter a voltage threshold at which the photo-responsive active layer switches between a first resistance state and a second resistance state.

2. The optically-controllable memory resistor of claim 1 wherein the photo-responsive active layer comprises a nanoscale film, the film comprising the transition metal oxide.

3. The optically-controllable memory resistor of claim 1 wherein a plurality of the memory resistors are formed into an array for storing data.

4. The optically-controlled memory resistor of claim 1 wherein the transition metal oxide comprises $TiO_2$.

5. The optically-controlled memory resistor of claim 1 wherein the memory resistor comprises a nanoscale memory resistor.

6. The optically-controlled memory resistor of claim 1 wherein the memory resistor further comprises a third electrode, wherein the photo-responsive active layer is positioned between the first, second and third electrodes.

7. The optically-controlled memory resistor of claim 6 wherein the memory resistor further comprises a fourth electrode, wherein the photo-responsive active layer is positioned between the first, second, third and fourth electrodes.

* * * * *